(12) United States Patent
Dusad

(10) Patent No.: US 8,766,721 B1
(45) Date of Patent: Jul. 1, 2014

(54) TIME GAIN COMPENSATION

(71) Applicant: Texas Instruments Incorporated, Dallas, TX (US)

(72) Inventor: Shagun Dusad, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 14 days.

(21) Appl. No.: 13/732,151

(22) Filed: Dec. 31, 2012

(51) Int. Cl.
H03F 3/45 (2006.01)

(52) U.S. Cl.
USPC .......................................... 330/254

(58) Field of Classification Search
USPC ............................... 330/252–261
See application file for complete search history.

(56) References Cited

U.S. PATENT DOCUMENTS

| 7,885,144 B2 * | 2/2011 | Oswal et al. ............... 367/98 |
| 7,948,315 B2 * | 5/2011 | Shifrin ....................... 330/254 |

* cited by examiner

Primary Examiner — Hieu Nguyen
(74) Attorney, Agent, or Firm — Alan A. R. Cooper; Frederick J. Telecky, Jr.

(57) ABSTRACT

In certain embodiments, circuits and methods for time gain compensation are provided. A circuit includes a first op-amp that is configured to compare a first and a second input voltage signal received from first and second input circuits, respectively, and output a first op-amp output signal. A control circuit coupled with a first semiconductor element of the second input circuit is configured to vary a first resistance value of the first semiconductor element to control the first op-amp output signal. The first op-amp output signal includes a relatively high voltage signal and a relative low voltage signal when an input control voltage signal corresponds to a first reference voltage and a second reference voltage signal, respectively associated with the first op-amp. The first op-amp output signal is input to a gate terminal of a load semiconductor element so-as to vary an impedance of the load semiconductor element.

20 Claims, 6 Drawing Sheets

TIME GAIN COMPENSATION

TECHNICAL FIELD

The present disclosure generally relates to time gain compensation.

BACKGROUND

In accordance with an exemplary scenario, various systems utilize echoes of previously transmitted signals for information generation. For example, an ultrasound system utilizes echoes of transmitted ultrasound signals to thereby generate information pertaining to visual and/or other information of an object. In accordance with one exemplary scenario, the ultrasound signals are transmitted to a subject, for example, a human body, from an ultrasound probe; in response, echoes of the acoustic energy are reflected from various acoustic impedance discontinuities within the body. Since the echoes are reflected from different depths of body parts, they undergo different attenuation. In order to compensate for loss in signal strength associated with the attenuation of the echoes, the received echoes are subjected to a variable gain (e.g., varying with time) by time gain compensation, thereby enabling the received echoes to be amplified to a substantially similar amplitude. The echoes are received by a transducer integrated within the ultrasound system. The echoes (or the reflected ultrasound signals) are amplified and digitized such that an ultrasound image of the subject may be generated.

SUMMARY

Circuits and methods for providing time gain compensation are disclosed. In one embodiment, a circuit includes or comprises a first operational amplifier (or "op-amp"), a first input circuit, a second input circuit and a control circuit. The first op-amp is configured to conduct a comparison between first input voltage signal and a second input voltage signal, and output a first op-amp output signal based on the comparison. The first input circuit is communicatively associated or coupled with the first op-amp and is configured to provide the first input voltage signal to the first op-amp. The first input signal is generated based on signal levels of an input control voltage signal and a first reference voltage signal. The second input circuit includes or comprises a first semiconductor element. The second input circuit is communicatively associated or coupled with an output terminal of the first op-amp. The second input circuit is configured to provide the second input voltage signal to the first op-amp. The second input voltage signal is generated based on signal levels of the first op-amp output signal and a relatively high voltage signal. The control circuit is communicatively associated or coupled with the first semiconductor element of the second input circuit and is configured to vary a first resistance value of the first semiconductor element to thereby control the first op-amp output signal. The first op-amp output signal includes or comprises the relatively high voltage signal when the input control voltage signal corresponds to the first reference voltage, and the first op-amp output signal includes or comprises a relatively low voltage signal when the input control voltage signal corresponds to a second reference voltage signal. In various embodiments, the first op-amp output signal is an input to a gate terminal of a load semiconductor element such that the first op-amp output signal is an input that may be implemented to vary an impedance of the load semiconductor element.

In one embodiment, a method of time gain compensation is provided. The method includes generating, by a first op-amp, a first op-amp output signal based on a comparison of a first input voltage signal generated by a first input circuit and a second input voltage signal generated by a second input circuit. The second input circuit includes or comprises a first semiconductor element having a first resistance value. The method also includes providing, by a control circuit, a slope control signal to the first semiconductor element of the second input circuit so as to vary the first resistance value associated with the first semiconductor element. The method further includes controlling the second input voltage signal based on the slope control signal being provided to the first semiconductor element and signal levels of the first op-amp output signal and a relatively high voltage signal to thereby control the first op-amp output signal. The first input voltage signal is generated based on signal levels of an input control voltage signal and the first reference voltage signal. The first op-amp output signal includes or comprises the relatively high voltage signal when the input control voltage signal corresponds to a first reference voltage, and the first op-amp output signal includes or comprises a relatively low voltage signal when the input control voltage signal corresponds to a second reference voltage signal. The first op-amp output signal is input to a gate terminal of a load semiconductor element such that the first op-amp output signal is an input that may be implemented to vary an impedance of the load semiconductor element.

In one embodiment, an integrated circuit (IC) configured for time gain compensation is disclosed. The IC includes a set of load semiconductor elements and a time gain compensation circuit. The set of load semiconductor elements is configured to provide an impedance. The load semiconductor elements from among the set of load semiconductor elements are switched from an ON state to an OFF state one after another so as to vary the impedance to thereby provide time gain compensation. The time gain compensation circuit is communicatively associated or coupled with the set of load semiconductor elements and is configured to facilitate switching of the load semiconductor elements of the set of load semiconductor elements from the ON state to the OFF state to vary the impedance of the load semiconductor elements associated with the set of load semiconductor elements.

In an embodiment, the time gain compensation circuit includes or comprises a set of first op-amps, a set of first input circuits, a set of second input circuits and a control circuit. Each first op-amp of the set of first op-amps is coupled with a respective load semiconductor element of the set of load semiconductor elements and comprises a respective output terminal, and is configured to conduct a comparison between a respective first input voltage signal and a respective second input voltage signal, and output a respective first op-amp output signal based on the comparison. Each of the set of first input circuits is communicatively associated or coupled with the respective first op-amp among the set of first op-amp and is configured to provide the respective first input voltage signal to the respective first op-amp. The respective first input signal is generated based on signal levels of an input control voltage signal and a respective first reference voltage signal input to the respective first op-amp. Each of the set of second input circuits includes or comprises a respective first semiconductor element from the set of first semiconductor elements. Each of the second input circuit is communicatively associated or coupled with a respective output terminal of the respective first op-amp, and is configured to provide the respective second input voltage signal to the respective first op-amp. The second input voltage signal is generated based on signal levels of the respective first op-amp output signal and a relatively high voltage signal. The control circuit is communicatively associated or coupled with each of the first semiconductor element of the set of first semiconductor elements and is configured to vary a first resistance value of the respective first semiconductor element to thereby control the respective first op-amp output signal. The respective first op-amp output signal includes or comprises the relatively high voltage signal when the input control voltage signal corresponds to the respective first reference voltage, and the first op-amp output signal includes or comprises a relatively low voltage signal when the input control voltage signal corresponds to a respective second reference voltage signal. In various embodiments, the respective first op-amp output signal is an input to a gate terminal of a respective load semiconductor element of the set of load semiconductor elements such that the first op-amp output signal is an input that may be implemented to vary an impedance of the respective load semiconductor element.

The drawings referred to in this description are not to be understood as being drawn to scale except if specifically noted, and such drawings are only exemplary in nature.

DETAILED DESCRIPTION OF THE EMBODIMENTS

Pursuant to an exemplary scenario, an ultrasound technique may be employed to obtain quantitative measurements in various applications, such as for applications pertaining to humans, animals, distance measurement, and the like. In one exemplary scenario, an ultrasound imaging system includes one or more transducer elements that emit ultrasound signals onto an object to be examined and receive back the echoes of these signals, which may be processed in order to determine or construct an image of the object. A block diagram of an exemplary ultrasound system is described herein with reference to FIG. 1.

Figure 1:
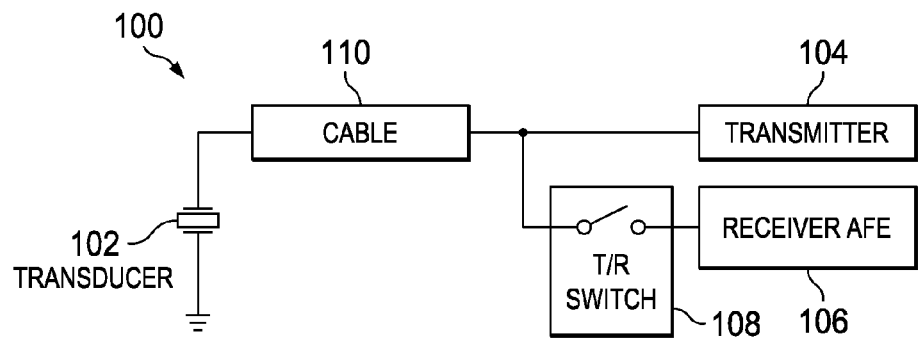
FIG. 1 illustrates a block diagram of an exemplary ultrasound system in accordance with an exemplary embodiment.

FIG. 1 illustrates a block diagram of an ultrasound system 100 in accordance with an exemplary embodiment. The ultrasound system 100 includes a transducer 102, a transmitter 104, a receiver analog front-end (AFE) 106, a transmit-receive (T/R) switch 108 and a cable or transmission line 110. The transmitter 104 emits transmit excitation pulses sufficient to oscillate the transducer 102 (or excite the transducer 102 to ultrasound oscillations). The transducer 102 is configured to operate in a transmitting mode as well as in a receiving mode. In the transmitting mode, the transducer 102 is configured to convert electrical signals into mechanical vibrations and produce "transmit ultrasonic signals". When the transmit ultrasonic signals travel in a medium, for example a body of a subject or a tissue, they experience attenuation due to scattering, absorption and other propagation effects. The transmit ultrasonic signals are then reflected from the medium in the form of "receive ultrasonic signals", and are received by the transducer 102. In the receiving mode, the receive ultrasonic signals cause the piezoelectric element of the transducer 102 to vibrate, and the transducer 102 converts the mechanical signals into electrical signals.

The ultrasonic signals received from the deeper tissues are attenuated more than the received signals from the near field tissues. Additionally, the reflected signals from the deeper tissues may take longer to reach the transducer than those reflected from the near field tissues. It is noted that the reflected or received ultrasonic signals may be referred to as "echoes" or "echo signals". In an embodiment, during the transmission of the transmit ultrasonic signals by the transmitter 104, an output of the transmitter 104 toggles at, or oscillates between, about +/−100 volts (V), between rail-to-rail, to thereby excite the transducer 102. In an embodiment, the T/R switch 108 is configured to protect the receiver AFE from the relatively high voltage ultrasonic signals transmitted from the transmitter 104.

The T/R switch 108 is followed by the receiver AFE 106, which includes various components configured to receive and process the received signal. For example, the receiver AFE 106 performs operations, such as attenuation, amplification, filtering and analog-to-digital conversion, on the reflected signals and provides the processed information to a receive beam former configured to form a consolidated beam. The 'receiver AFE' may be referred to, for example, as a 'receiver front-end', and, accordingly, the terms 'receiver front-end' and 'receiver AFE' are used interchangeably throughout the description. A block diagram of the receiver AFE of the ultrasound system 100 is illustrated in FIG. 2.

Figure 2:
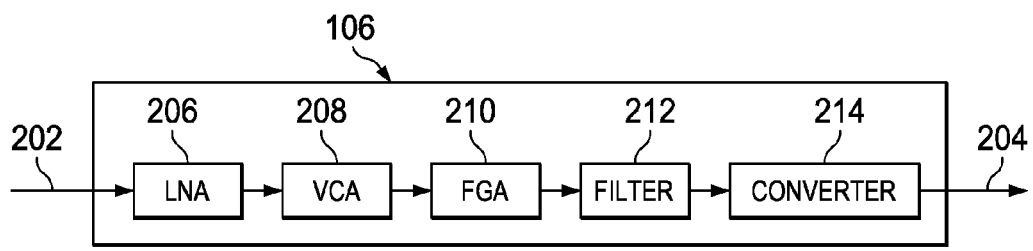
FIG. 2 illustrates a block diagram of an exemplary receiver front-end of the ultrasound system of FIG. 1 in accordance with an exemplary embodiment.

FIG. 2 illustrates a block diagram of the receiver AFE 106 of the ultrasound system 100 of FIG. 1 in accordance with an exemplary embodiment. The receiver AFE 106 includes a receiver processing chain having blocks representative of various operations, such as attenuation, amplification, filtering, analog-to-digital conversion, and the like, performed by the receiver AFE 106 on the reflected signals (or the echoes). It is noted that various operations performed in the receiver AFE 106 may be collectively referred to as a "receiver processing chain". The receiver AFE 106 of FIG. 2 is shown to include a single receiver processing chain configured to receive an input signal from a transducer (for example, the transducer 102). However, it is noted that the receiver AFE 106 may include a plurality of receiver processing chains, such that each receiver processing chain receives input from a transducer from among the array of transducers. Additionally, since the receiver AFE 106 includes the receiver processing chain, which may be implemented to process the reflected signals (or the echoes), the terms "receiver processing chain" and the "receiver AFE" may be used interchangeably.

As illustrated in FIG. 2, the reflected signals or the one or more echoes 202 are input and processed at the receiver AFE 106 such that a received signal 204 may be generated at the output of the receiver AFE 106. The receiver AFE 106 includes a low noise amplifier (LNA) 206, a voltage controlled attenuator (VCA) 208, a fixed gain amplifier (FGA) 210, a filter 212 and an analog-to-digital converter (ADC) 214. The LNA 206 is configured to amplify the received signal echo 202 with minimum noise addition. The input to the LNA 206 varies, for example, from as large as 2 V peak-to-peak ("p-p") to as low as noise floor of the receiver processing chain. In order to get a relatively low input referred noise when the input signal is small, a gain is provided in the LNA 206 and the FGA 210. The LNA 206 forwards the amplified signal to the VCA 208.

In an embodiment, since the echoes are reflected from different depths of the body parts, they undergo different attenuation. In order to compensate for loss in signal strength associated with the attenuation of the echoes, the received echoes are subjected to a variable gain (e.g., varying with time) by time gain compensation, thereby enabling the received echoes to be amplified to a substantially similar amplitude at the ADC input. This process may be referred to as 'time gain compensation'.

In an embodiment, the VCA 208 is coupled with or connected to the FGA 210, and the VCA 208 and the FGA 210 collectively provide time gain compensation so as to enable the received echoes (which correspond to a single transmitted pulse) to be amplified to a same, or substantially similar, preselected amplitude level. In an embodiment, a same or similar preselected amplitude level may be equal to the full-scale range of the ADC 214 in the receiver processing chain (for example, the ADC 214 with respect to the receiver processing chain illustrated in FIG. 2). In an embodiment, at a relatively high signal level or strength, the VCA 208 is used to get the ADC 214 input within its dynamic range. For example, at maximum input, the VCA 208 provides a relatively high or maximum attenuation so as to maintain the ADC 214 input within a preselected amplitude range. As the signal level reduces, the attenuation provided by the VCA 208 is reduced so as to prevent a decrease in amplitude of the input to the ADC 214 (such as by maintaining the input to the ADC 214 as large as possible).

The output of the FGA 210 is provided to the anti-aliasing filter 212. The filter 212 removes those frequency components from the output of the FGA 210 that are above a preselected frequency The ADC 214 samples the gained and anti-alias filtered signals received from the output of the filter 212 at corresponding sampling time instances so as to generate or output corresponding digital codes (for example, the output signal 204). The ADC 214 forwards the digital codes to a receive beam former, which may then generate a consolidated receiver signal or a number of beams. The receiver beams are processed such that the processed beams may be implemented to generate the image.

In an embodiment, the attenuation provided by the VCA 208 is varied based on an input voltage supplied to the VCA 208. The input voltage may be referred to, for example, as an input control voltage, since a change in a voltage level of the input control voltage ($V_{ctrl}$) changes the attenuation provided by the VCA 208. In an embodiment, the $V_{ctrl}$ may be varied from a level zero (0) to a level unity (1) such that the attenuation provided by the VCA 208 is varied from a maximum level to a minimum level. In an embodiment, the input signal envelope to the LNA 206 follows a "decibel (dB) linear" profile, and accordingly, the attenuation provided by the VCA 208 is dB linear. The configuration of the VCA 208 is explained in more detail herein with reference to FIG. 3.

Figure 3:
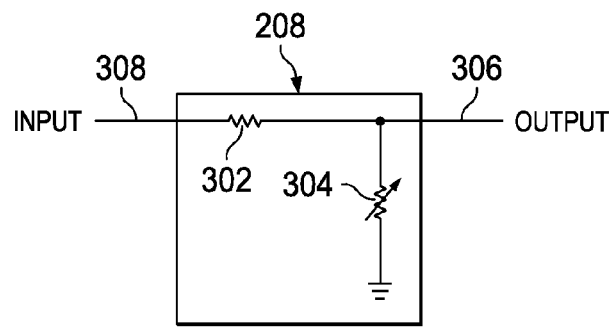
FIG. 3 illustrates a circuit diagram of an exemplary attenuator (e.g. a VCA) of a receiver front-end in accordance with an embodiment.

FIG. 3 illustrates a circuit diagram of the VCA 208 of the receiver AFE in accordance with an embodiment. In an embodiment, the VCA 208 includes or comprises a series resistor 302 and a variable shunt impedance 304 such that the series resistor 302 and the variable shunt impedance 304 are collectively configurable to provide an impedance ratio. In an embodiment, the attenuation provided by the VCA 208 is determined by the impedance ratio. For example, the attenuation provided by the VCA 208 may be represented by the following expression:

$$\text{Attenuation}_{(VCA)} = R_{load}/(R_{load} + R_{in}),$$

where, $R_{load}$ represents the impedance value of the variable shunt resistor 304, and $R_{in}$ represents the impedance value of the series resistor 302.

In an embodiment, the relation between the input and the output of the attenuator 208 is represented by the following expression:

$$\text{OUTPUT 306 of the VCA 208} = R_{load}/(R_{load} + R_{in}) \times \text{INPUT 308 of the VCA 208}.$$

In an embodiment, the shunt resistor (or the load resistance $R_{load}$) 304 is implemented by using a set of metal oxide semiconductor (MOS) transistors coupled or connected in parallel. An implementation of $R_{load}$ using the set of MOS transistors is described in more detail herein with reference to FIG. 4.

Figure 4:
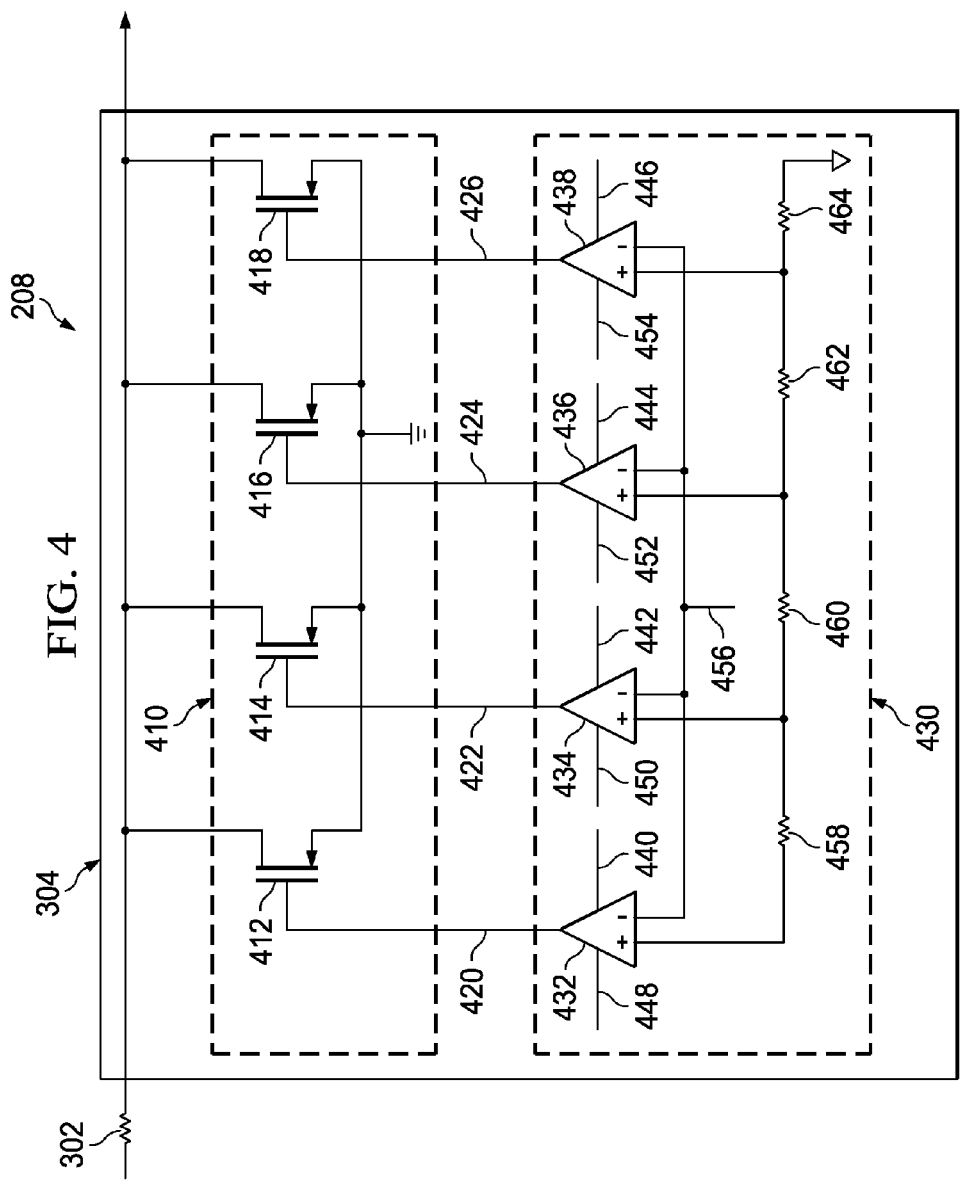
FIG. 4 illustrates a circuit implementation of an exemplary voltage controlled attenuator (VCA) in accordance with an exemplary embodiment.

FIG. 4 illustrates a circuit implementation of the VCA 208 in accordance with an exemplary embodiment, wherein the shunt resistor (or the load resistor, $R_{load}$ described herein with reference to FIG. 3) 304 is implemented by using a set of load semiconductor elements. The different load semiconductor elements of the set of load semiconductor elements are selected based on the attenuation profile. In an exemplary embodiment, the set of load semiconductor elements may include a plurality of MOS transistors, such as, for example, a set of MOS transistors 410. Referring to FIG. 4, the plurality of MOS transistors 410 is shown to include a number of MOS transistors, for example, MOS transistors 412, 414, 416, and 418 coupled or connected in parallel. In an embodiment, each of the plurality of MOS transistors, such as MOS transistors 412, 414, 416, and 418 that are configuring the load resistor $R_{load}$ may hereinafter be referred to as a load semiconductor element. In an embodiment, the plurality of transistors 410 operates in a triode region. As used herein, the term 'triode region' of the transistor refers to a region that is created when the transistor is turned on, and the triode region so created allows the current to flow from between the drain and the source. In the triode region, the transistor operates similar to a resistor, and its resistance value is controlled by the gate voltage relative to source voltage.

The gate voltages ($V_{GATE}$), for example, gate voltages 420, 422, 424, and 426 of the respective transistors, for example, transistors 412, 414, 416, 418, are varied from a respective low voltage signal level, for example low voltage signal 440, 442, 444, 446 to a respective high voltage signal level 448, 450, 452, 454. As the gate voltages 420, 422, 424, and 426 of the transistors are varied, the value of resistance associated with the respective transistors for example, transistors 412, 414, 416, 418) is changed, thereby varying the attenuation provided by the VCA 208.

In an exemplary illustration of FIG. 4, the MOS transistor resistor 410 is implemented by using four transistors, for example, the MOS transistors 412, 414, 416, and 418. In an embodiment, the attenuation provided by the VCA 208 is varied by switching the transistors 412, 414, 416 and 418 from an ON state to OFF state (i.e., from an active state to an inactive state) one after another. For example, a maximum attenuation is given by the attenuator 208 when each transistor from among a plurality of the transistors is activated or in an ON state. The level of attenuation begins to decrease when the transistor gate voltages are varied one after another. In various embodiments, the attenuation given by the attenuator 208 is minimum when each transistor from among a plurality of the transistors of the MOS transistor resistor 410 is deactivated or switched OFF.

In an embodiment, each of the transistors of the set of transistors is associated with a different input control voltage range such that a dB linear attenuation with respect to input control voltage may be achieved. In an embodiment, the number of transistors for a given attenuation range is determined based on a precision with which the attenuation profile is to be matched to the dB linear curve. In an embodiment, the implementation of a greater number of transistors yields a better attenuation profile. For example, in the exemplary embodiment illustrated in FIG. 4, four transistors are shown to be implemented in order to provide attenuation by the VCA 208. However, in various embodiments, the load resistor $R_{load}$, such as, for example, the MOS transistor resistor 410, may be implemented by using a greater or lower number of transistors.

In various embodiments, the gate voltage input to each transistor from among the set of MOS transistors (associated with the MOS transistor resistor 410) is varied one after another for changing MOS transistors from the ON state to the OFF state, thereby varying the attenuation provided by the VCA 208. In various embodiments, the gate voltage (for example, the gate voltage 420) input to each transistor from among the set of MOS transistors (and, accordingly, the attenuation) may be varied by implementing a circuit, for example, a time compensation circuit 430.

As illustrated in FIG. 4, the time gain compensation circuit 430 is configured to output the gate voltage signal (for example, signals 420, 422, 424, 426), which may be provided as an input to the gate terminals of respective transistors that may be implemented to vary the respective transistor impedances.

In various embodiments, the time gain compensation circuit 430 includes a plurality of comparators such that the output of each comparator facilitates a controlling of a gate voltage (for example, the gate voltage 420) associated with the set of MOS transistors 410. Referring to FIG. 4, the time gain compensation circuit 430 includes four comparators, 432, 434, 436 and 438. Each of the four comparators runs on a relatively high supply voltage ($V_{HIGH}$) and a relatively low supply voltage ($V_{LOW}$), and output of each of the four comparators changes in respective input control voltage ranges thereof. As disclosed herein, $V_{HIGH}$ refers to a voltage such that when all the MOS transistors have $V_{HIGH}$ gate voltage, the attenuation is maximum. Also, $V_{LOW}$ herein refers to a voltage such that when all the MOS transistors have $V_{Low}$ gate voltage, the attenuation is minimum.

In an embodiment, each of the comparator is configured to receive a varying signal level of the input control voltage signal 456 and a reference signal at inputs. In an embodiment, the comparator is configured to receive the reference voltage based on a voltage divider circuit being implemented by means of a plurality of resistors, for example, resistors 458, 460, 462, 464. The different values of references corresponding to different comparators ensure that each comparator operates only at its input control voltage range. In various embodiments, when input control voltage crosses a particular reference value, the corresponding comparator output starts changing and the previous comparator output value stops changing. In particular, in response to the change in the comparator voltages, the corresponding MOS transistor changes from an ON or activated state to an OFF or deactivated state, thereby varying the attenuation.

In the present embodiment, as four comparators are utilized, each comparator is assumed to have an operating range of about 250 millivolts (mV) (e.g., ¼ of the total input control voltage range). As $V_{CTRL}$ varies from a signal level '0' to a signal level '1', the respective output of each of the comparators 432, 434, 436 and 438 changes from $V_{HIGH}$ to $V_{LOW}$ one by one, thereby varying the attenuation from a maximum value to a minimum (no attenuation) value. For example, when the signal level of input control voltage signal 460 is '0', the attenuation is maximum, whereas at the signal level '1', there is no attenuation.

Referring again to FIG. 4, the series resistor 302 in the VCA 208 is implemented by utilizing a physical resistor. The VCA 208 is implemented by utilizing the physical resistor rather than a MOS transistor, because the implementation of the series resistor 302 using the MOS transistor resistor may degrade linearity (signal distortion) in the VCA. Particularly, the physical resistor varies differently as compared to a MOS transistor resistor across process corners and with temperature variation. It is noted that the term "process corner" may refer to the extremes of various parameters for which a semiconductor element is designed or manufactured.

As described herein with reference to FIG. 4, the relatively high supply voltage ($V_{HIGH}$) and the relatively low supply voltage ($V_{LOW}$) are generated in an open-loop configuration consequently, their generation does not track the variation of MOS resistor value with respect to physical resistor across temperature variation and across process corners, thereby causing the attenuation profile to be unpredictable across process corners and varying temperature.

Also, in so much as the plurality of comparators for example, the comparators 432, 434, 436 and 438 utilized for the generation of the respective gate voltage (for example, 420, 422, 424, 426), are in an open-loop, their gain also changes across process corners and temperature, thereby changing the slope of the output of the plurality of comparators. Accordingly, the gate voltage of the respective comparator reaches from $V_{HIGH}$ to $V_{LOW}$ faster or slower than the nominal case, and, as a result, each MOS transistor resistor either finishes its attenuation range either earlier or later, thereby causing more ripples in the attenuation profile.

In an embodiment, in order to prevent the effect of temperature variation and process corners on attenuation range, the output of the plurality of comparators is changed from the signal level $V_{HIGH}$ to the signal level $V_{LOW}$ when $V_{CTRL}$ is swept through respective input control voltage range. $V_{HIGH}$ and $V_{LOW}$ are generated in a manner such that MOS resistor value tracks the physical resistor value across process and temperature.

Figure 5:
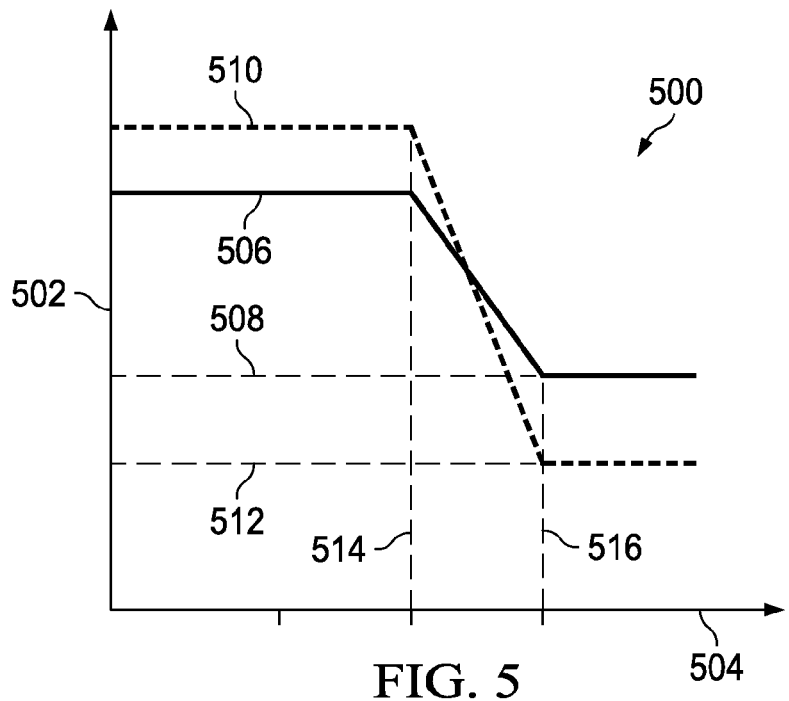
FIG. 5 illustrates an exemplary variation of a gate voltage signal of a load semiconductor element of a VCA with an input control voltage signal in different process corners in accordance with an embodiment.

FIG. 5 illustrates an exemplary variation 500 of a gate voltage signal 502 (for example, $V_{GATE1}$) with a input control voltage signal 504 (for example, $V_{CTRL}$) at process corners of a MOS transistor, for example the MOS transistor 412, in accordance with an embodiment. In the present embodiment, the relatively high supply voltage ($V_{HIGH}$) and the relatively low supply voltage ($V_{LOW}$) of a comparator, for example, the comparator 432, assumes a value of, for example, a relatively high supply voltage 506 and a relatively low supply voltage 508 in one process corner, and a relatively high supply voltage 510 and a relatively low supply voltage 512, respectively, in another process corner. Then, in the first process corner, the output of the comparator 432 should change from the relatively high supply voltage 506 at the input control voltage signal level 514 to the relatively low supply voltage 508 at the input control voltage signal level 516. Similarly, in the second process corner, the output of the comparator 432 should change from the relatively high supply voltage 510 at the input control voltage signal level 514 to the relatively low supply voltage 512 at the input control voltage signal level 516.

For the comparator output voltage to change in a manner as described herein with reference to FIG. 5, various embodiments provide circuits and methods that facilitate the generation of the comparator output voltage in a closed loop. Various embodiments disclose circuits and methods for tracking the variation of the MOS transistor resistor with the physical resistor in a closed loop architecture. For example, various embodiments disclose circuits configured to generate the relatively high voltage signal and the relatively low voltage signals in a closed loop, thereby tracking the MOS transistor resistor variation with respect to physical resistor. Various other embodiments facilitate a provisioning of closed loop comparators for controlling the gain of the comparator. For example, in various embodiments, a control circuit is provided for varying/adjusting a slope of the comparator across process corners. In various embodiments, an operational amplifiers (op-amp) may be an example of the comparator.

Figure 6:
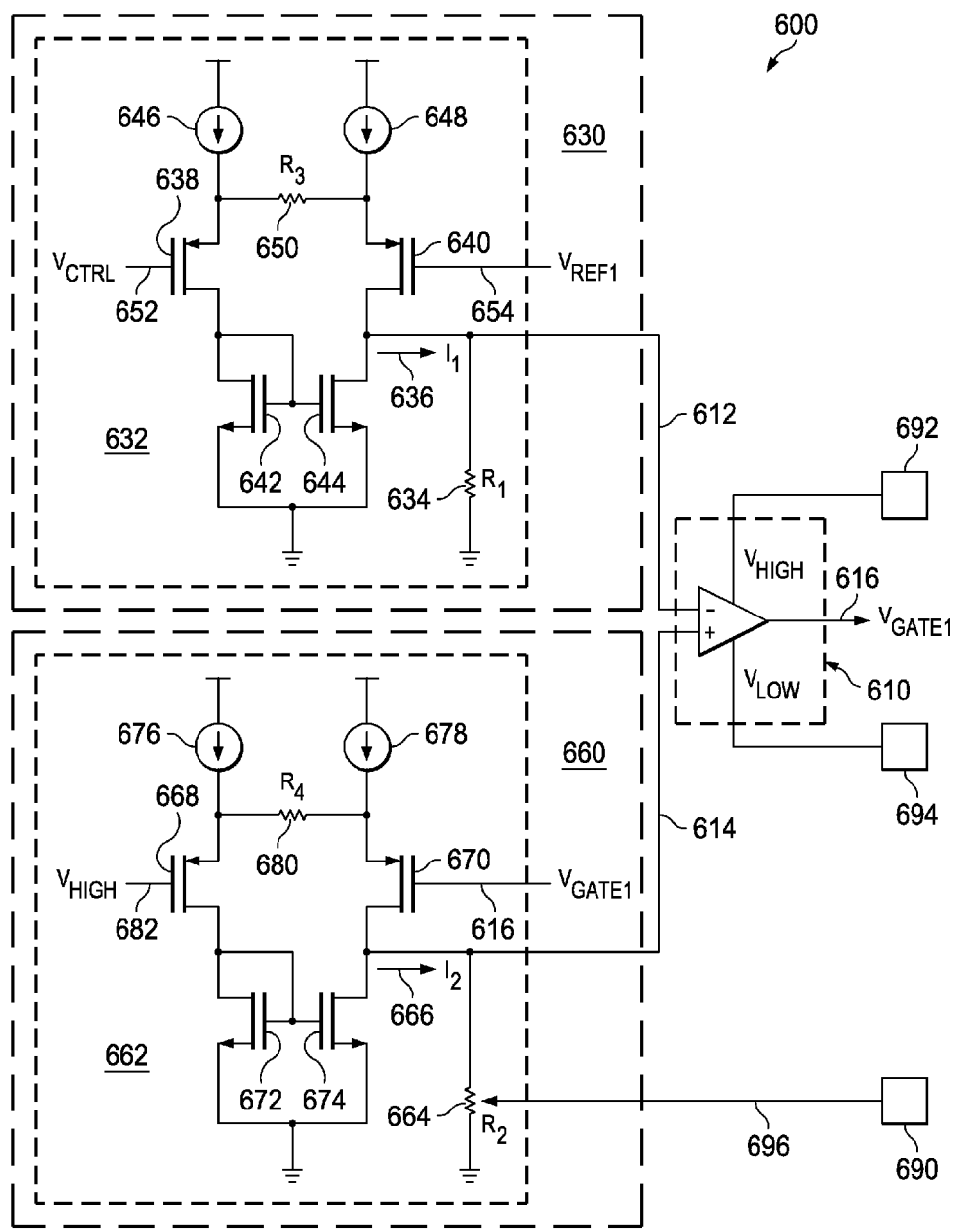
FIG. 6 illustrates an exemplary circuit for time gain compensation in accordance with an embodiment.

FIG. 6 illustrates a circuit 600 for time gain compensation in accordance with an embodiment. As depicted, the circuit 600 is logically divided into four parts: a first operational amplifier (op-amp) 610, a first input circuit 630, a second input circuit 660, and a control circuit 690. In an exemplary scenario, a time gain compensation may be explained with reference to the exemplary embodiment of the time gain compensation circuit 600 shown in FIG. 6. Moreover, pursuant to one exemplary scenario, the time gain compensation may be provided by implementing a feedback loop (or a closed loop architecture) such that output voltages of the first op-amp 610 may be generated. Also, in various embodiments, a closed loop configuration/architecture for the op-amp, for example, the first op-amp 610, is disclosed such that the slope of a first op-amp output may be adjusted across process corners and temperature variation. In various embodiments, the op-amp, for example, the first op-amp 610 is an example of a comparator, for example, the comparator 432.

The first op-amp 610 is configured to receive a first input voltage signal, for example, a first input voltage signal 612 and a second input voltage signal, for example, a second input voltage signal 614. In various embodiments, the first op-amp 610 is configured to compare the first input voltage signal 612 with the second input voltage signal 614 and, in response, generate a first op-amp output signal, for example, a first op-amp output signal 616. In various embodiments, the first op-amp output signal 616 is provided as an input (for example, $V_{GATE1}$) to a gate terminal of a MOS transistor, for example, the MOS transistor 412 (see, e.g., FIG. 4). In various embodiments, the first op-amp output signal 616 is varied so as to provide a variable input signal, for example, $V_{GATE1}$, to the gate terminal of a load semiconductor element, such as, for example, a MOS transistor from among a set of MOS transistors. In various embodiments, providing the variable input signal to the load semiconductor element varies the attenuation of a VCA, such as, for example, the VCA 208 (see, e.g., FIG. 2).

In various embodiments, the time gain compensation circuit 600 output changes as the value of the input control voltage signal ($V_{CTRL}$), for example, the input control voltage signal $V_{CTRL}$ from a first reference voltage value ($V_{REF1}$) to a second reference voltage value ($V_{REF2}$) when the value of the first op-amp output signal 616 varies from the signal levels of the relatively high voltage signal ($V_{HIGH}$) to that of the relatively low voltage signal ($V_{LOW}$). In various embodiments, the first op-amp output signal 616 is to be changed from $V_{HIGH}$ to $V_{LOW}$ when $V_{CTRL}$ changes from $V_{REF1}$ to $V_{REF2}$. Since, at different process corner and with temperature variation, MOS resistor value does not track the physical resistor value, therefore $V_{HIGH}$ and $V_{LOW}$ are to be generated according to process corner and in the process corner, the op-amp output should change from $V_{HIGH}$ (specific to that process corner and temperature) at $V_{REF1}$ to $V_{LOW}$ (specific to that process corner and temperature) at $V_{REF2}$. For example, referring to FIG. 5, if $V_{HIGH}$ and $V_{LOW}$ assume a value of $V_{HIGH\_1}$ and $V_{LOW\_1}$ in one process corner and $V_{HIGH\_2}$ and $V_{LOW\_2}$ in another process corner, then, in the first process corner, the first op-amp output signal changes from $V_{HIGH\_1}$ at $V_{REF1}$ to $V_{LOW\_1}$ at $V_{REF2}$. Also, in the second process corner, the first op-amp output signal changes from $V_{HIGH\_2}$ at $V_{REF1}$ to $V_{LOW\_2}$ at $V_{REF2}$. Accordingly, in various embodiments, the $V_{HIGH}$ signal and the $V_{LOW}$ signal are generated to track the variation in the physical resistor, for example the physical resistor 302 (see, e.g., FIG. 4) with respect to the process corners and temperature.

In certain exemplary embodiments, the $V_{HIGH}$ signal and the $V_{LOW}$ signal may be generated by utilizing a relatively high voltage generation circuit and a relatively low voltage generation circuit. The relatively high voltage generation circuit and the relatively low voltage generation circuit are communicatively associated or coupled with the first op-amp 610. In various embodiments, the relatively high voltage generation circuit, for example, a relatively high voltage generation circuit 692 and the relatively low voltage generation circuit, for example, a relatively low voltage generation circuit 694 is communicatively associated or coupled with the first op-amp 610 at the negative and positive power supply, respectively, thereof. In some embodiments, op-amp may not be provided with $V_{HIGH}$ and $V_{LOW}$ as supplies. Instead, the output of the op-amp may be clamped to the levels of voltages $V_{HIGH}$ and $V_{LOW}$, such that the op-amp output always vary between $V_{HIGH}$ and $V_{LOW}$ voltage levels. Various embodiments illustrating an example of a relatively high voltage generation circuit and an example of a relatively low voltage generation circuit are illustrated and explained in detail in FIGS. 7A and 7B, respectively.

As discussed previously, the first op-amp 610 is configured to receive the first input voltage signal and the second input voltage signal from the first input circuit 630 and the second input circuit 660, respectively. The first input circuit 630 is coupled with or connected to the first op-amp 610 and is configured to provide the first input voltage signal 612 to the first op-amp 610. In an exemplary embodiment, the first input circuit 630 includes a first current source 632 coupled with or connected to the first op-amp 610 and a first resistive element 634 coupled with or connected to the first current source 632.

In various embodiments, the first resistive element 634 includes or comprises a second resistance value. In various embodiments, the first resistive element 634 includes or comprises terminals, such that one terminal of the first resistive element is coupled with or connected to an output of the first current source 632 and the first op-amp 610, while the second terminal of the first resistive element is coupled with or connected to a source at a ground potential.

In an exemplary embodiment, the first current source 632 includes a first differential input circuit (see, e.g., FIG. 6) configured to generate a first current signal 636. In an embodiment, the first differential circuit includes transistors, for example, transistors 638, 640, 642, and 644. The respective source terminals of the transistors 638 and 640 are communicatively associated or coupled with a current source, for example, a current source 646 and 648, respectively. Also, the drain terminals of the transistor 638 and 640 are communicatively associated or coupled with the drain terminals of the transistors 642 and 644, respectively. The gate terminals of the transistor 642 and 644 are coupled, while the source terminals of the transistors 642 and 644 are communicatively associated or coupled with a source at a ground potential. The differential circuit 632 further includes or comprises a second resistive element, such as, for example, a second resistive element 650 ($R_3$) coupled between the source terminals of the transistors 638 and 640. In an embodiment, the second resistive element 650 is associated with a third resistance value.

In various embodiments, the first current source 632 is configured to generate the first current signal 636 based on a voltage level of a input control voltage signal, for example the input control voltage signal 652 and a first reference signal, for example, a first reference voltage signal 654. The expression for the first current signal ($I_1$) 636 output from the differential circuit 632 is given by:

$$I_1 = k \times (V_{CTRL} - V_{REF1})/R_3$$

where, $I_1$ is the first current signal 636 generated by the first current source 632, $V_{CTRL}$ represents a voltage level of the input control voltage signal 652, $V_{REF1}$ represents a voltage level of the first reference voltage 654, and $R_3$ is the second resistive element utilized for converting the difference between the input control voltage and the respective first reference voltage into current output.

Herein, k is a constant. In an exemplary embodiment, the value of k is 2.

In an embodiment, the second input circuit 660 is communicatively associated or coupled with the first op-amp 610 and is configured to provide the second input voltage signal 614 to the first op-amp 610. The second input circuit 660 includes or comprises a second current source 662, and a first semiconductor element, for example, a first semiconductor element 664 communicatively associated or coupled with the second current source 662. The second current source 662 is configured to generate a second current signal ($I_2$), for example, a second current signal 666.

As illustrated in FIG. 6, the second current source 662 includes a differential input circuit (see, e.g., FIG. 6) having transistors 668, 670, 672, and 674. The respective source terminals of the transistors 668 and 670 are communicatively associated or coupled with a current source, for example, a current source 676 and 678, respectively. Also, the drain terminals of the transistor 668 and 670 are communicatively associated or coupled with the drain terminals of the transistors 672 and 674, respectively. The gate terminals of the transistor 672 and 674 are coupled to each other, while the source terminals of the transistors 672 and 674 are communicatively associated or coupled with a source at a ground potential. The differential circuit 662 further includes or comprises a third resistive element, for example, a third resistive element 680 ($R_4$) coupled between the source terminals of the transistors 668 and 670. In an embodiment, the third resistive element 680 is associated with a fourth resistance value.

In various embodiments, the second current source 662 is configured to generate the second current signal 666 based on a voltage level of the op-amp output signal, for example the op-amp output signal 616 and a relatively high voltage signal, for example, a relatively high voltage signal 682. The expression for the second current signal ($I_2$) 666 output from the differential circuit 662 is given by:

$$I_2 = k^*(V_{GATE1} - V_{HIGH})/R_4$$

where, $I_2$ is the second current signal 666 being generated by the second current source 662, $V_{GATE1}$ is the first op-amp output voltage signal 616, $V_{HIGH}$ is the relatively high voltage signal 682, and $R_4$ is the third resistive element utilized for converting the difference between the first op-amp output voltage and relatively high voltage into current output.

In an embodiment, the first semiconductor element 664 includes or comprises a first resistance value. In various embodiments, the second input circuit 662 is configured to provide the second input voltage signal 614 to the first op-amp 610 based on the second current signal 666 and the first resistance value 664.

In the present embodiment, the output slope of the first op-amp 610 is varied across process corner and temperature in a manner such that at $V_{REF1}$ the value is $V_{HIGH}$ and at $V_{REF2}$ the value is $V_{LOW}$. In an embodiment, for varying the output slope of the first op-amp 610 across process corners and temperature, a feedback loop from the output of the first op-amp 610 to a gate terminal of the transistor 670 of the second current source 662 is provided. As already discussed, the current signal associated with the first current source 632 and the second current source 662 are generated as:

$$I_1 = k^*(V_{CTRL} - V_{REF1})/R_3$$

$$I_2 = k^*(V_{GATE1} - V_{HIGH})/R_4$$

where, $V_{REF1}$ is the value of $V_{CTRL}$ at which the first op-amp 610 enters in its operating region.

In various embodiments, the feedback loop ensures that the first input voltage signal ($V_{INP}$), for example the first input voltage signal 612 is same as second input voltage signal ($V_{INM}$), for example the second input voltage signal 614.

Accordingly, $-I_1 R_1 = I_2 * R_2$ $$-k^*(V_{CTRL} - V_{REF1})/R_3 * R_1 = k^*(V_{GATE1} - V_{HIGH})/R_4 * R_2$$

$$-V_{GATE1} = V_{HIGH} + R_1 * R_4 * (V_{CTRL} - V_{REF1})/(R_3 * R_2) \quad (1)$$

The equation (1) shows that by adjusting $R_1 * R_4/(R_2 * R_3)$, the slope of the output of the first op-amp 610 can be changed.

In equation (1), at $V_{CTRL} = V_{REF2}$, the op-amp 610 output signal 616 is maintained relatively low, for example, at a voltage level $V_{LOW}$ to thereby maintain the attenuation profile. Here, $V_{REF2}$ is the value of $V_{CTRL}$ where the operating region of the first op-amp 610 ends. By replacing $V_{CTRL}$ with $V_{REF2}$, and $V_{GATE1}$ with $V_{LOW}$ in the equation (1), the resulting equation becomes $$V_{LOW} = V_{HIGH} + R_1 * R_4 * (V_{REF2} - V_{REF1})/(R_3 * R_2) \quad (2)$$

In equation (2), the voltage levels (or the values) of $V_{LOW}$, $V_{HIGH}$, $V_{REF1}$ and $V_{REF2}$ are known, and therefore, by implementing equation (2), the slope of the output signal of the op-amp 610 can be adjusted across process corners and temperature variation. An exemplary embodiment illustrating a control circuit (for example, the control circuit 690) for adjusting the slope of the first op-amp 610 across process corners is described with reference to FIG. 8. In particular, in the exemplary embodiment of FIG. 8, the control circuit 690 utilizing equation (2) generates a slope control signal, for example a slope control signal 696 for adjusting the output slope of the first op-amp 610.

Figure 7A:
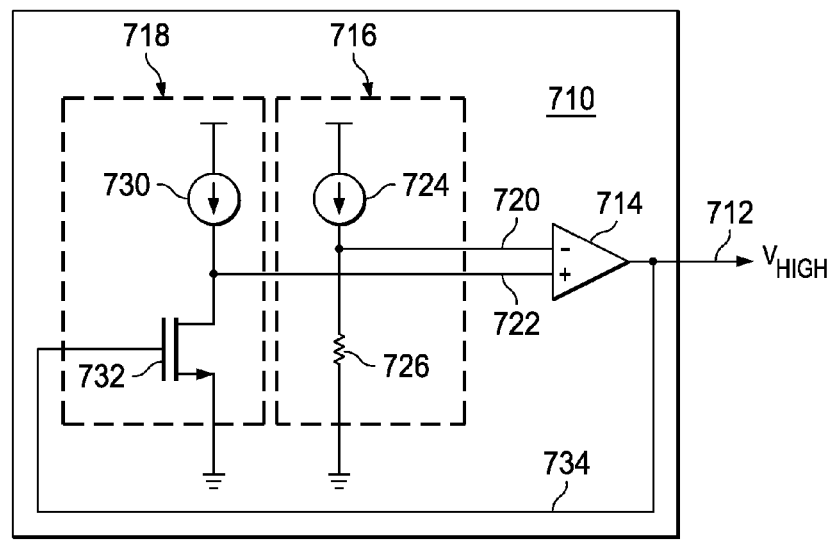
FIGS. 7A and 7B illustrate exemplary circuits configured for the generation of a relatively high voltage signal and a relatively low voltage signal in a closed loop configuration in accordance with an embodiment.
Figure 7B:
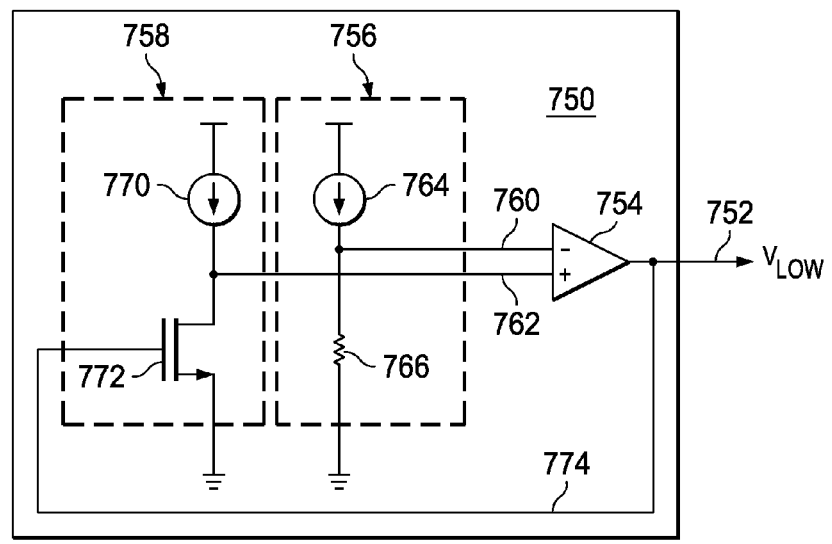

FIGS. 7A and 7B illustrate circuits for generation of supply voltage signals, for example, a relatively high voltage signal and a relatively low voltage signal associated with a first op-amp, for example the first op-amp 610 in closed loop in accordance with an embodiment. In particular, FIG. 7A illustrates the implementation of a circuit 710 for generation of a relatively high supply voltage, for example, a relatively high voltage signal $V_{HIGH}$ 712. In various embodiments, the circuit 710 is an example of the relatively high voltage generation circuit 692 (see, e.g., FIG. 6). Also, FIG. 7B illustrates a circuit 750 for generation of a relatively low voltage signal, for example, a relatively low voltage $V_{LOW}$ 752 associated with the first op-amp 610. In various embodiments, the circuit 750 is an example of the relatively low voltage generation circuit 694 (see, e.g., FIG. 6).

As illustrated in FIG. 7A, the relatively high voltage generation circuit 710 includes a second op-amp 714, a third input circuit 716 and a fourth input circuit 718. The third input circuit 716 and the fourth input circuit 718 are coupled with or connected to the second op-amp 714 and configured to generate a third input voltage signal 720 and a fourth input voltage signal 722, respectively. The second op-amp 714 includes or comprises an inverting terminal and a non-inverting terminal for receiving the third input voltage signal 720 and the fourth input voltage signal 722, respectively. The second op-amp 714 is further configured to compare the third input voltage signal 720 with the fourth input voltage signal 722, and in response generate the relatively high voltage signal 712.

In various embodiments, the third input circuit 716 includes or comprises a third current source 724 coupled with or connected to a fourth resistive element 726. In particular, one terminal of the fourth resistive element 726 is coupled with or connected to the third current source 724 while the other terminal of the fourth resistive element 726 is coupled to or connected to a ground terminal and has a fifth resistance value. In an embodiment, the fourth resistive element 726 is similar to the physical resistor 302 (see, e.g., FIG. 4). In various embodiments, the fifth resistance value is equal to an ON-resistance value of the load semiconductor element (for example, the transistor 412 discussed in FIG. 4). As used herein, the term "ON-Resistance" refers to the resistance of a load element (for example, the load semiconductor element) corresponding to maximum attenuation given by the element.

In various embodiments, the fourth input circuit 718 includes or comprises a fourth current source 730 coupled with or connected to a second semiconductor element 732 having a sixth resistance value. In particular, the fourth current source 730 is communicatively associated or coupled with a drain terminal of the second semiconductor element 732, while the source terminal of the second semiconductor element 732 is coupled with or connected to a source at a ground potential. In various embodiments a gate terminal of the second semiconductor element 732 is configured to receive the relatively high voltage signal 712 from the output of the second op-amp 714 by implementing a feedback loop, for example, a feedback loop 734. The second semiconductor element 732 is similar to the transistors, for example, the transistor 412 of the plurality of transistors 410 (see, e.g., FIG. 4). In various embodiments, a working load of the second semiconductor element 732 is equal to a working load of the load semiconductor element (for example, the transistor 412 discussed in FIG. 4). As used herein, the having the same working load implies that both the elements, for example the load semiconductor element and the second semiconductor element have same functionality, and one element for example, the second semiconductor element replicates the other element, for example, the load semiconductor element. In an embodiment, the second semiconductor element 732 is operable in the linear region.

Referring now to FIG. 7B, the relatively low voltage generation circuit 750 includes a third op-amp 754, a fifth input circuit 756 and a sixth input circuit 758. The fifth input circuit 756 and the sixth input circuit 758 are coupled with or connected to the third op-amp 754 and configured to generate a fifth input voltage signal 760 and a sixth input voltage signal 762, respectively. The third op-amp 754 includes or comprises an inverting terminal and a non-inverting terminal for receiving the fifth input voltage signal 760 and the sixth input voltage signal 762, respectively. The third op-amp 754 is further configured to compare the fifth input voltage signal 760 with the sixth input voltage signal 762, and in response generate the relatively low voltage signal 752.

In various embodiments, the fifth input circuit 756 includes or comprises a fifth current source 764 communicatively associated or coupled with a fifth resistive element 766. In particular, one terminal of the fifth resistive element 766 is coupled with or connected to the fifth current source 764 while the other terminal of the fifth resistive element 766 is coupled with or connected to a source at a ground potential. In an embodiment, the fifth resistive element includes or comprises a seventh resistance value. In an embodiment, the fifth resistive element 766 is similar to the physical resistor 302 (see, e.g., FIG. 4). In various embodiments, the seventh resistance value is equal to an OFF-resistance value of the load semiconductor element (for example, the transistor 412 discussed in FIG. 4). As used herein, the term "OFF-Resistance" refers to the resistance of a load element (for example, the load semiconductor element) corresponding to minimum attenuation given by the element.

In various embodiments, the sixth input circuit 758 includes or comprises a sixth current source 770 communicatively associated or coupled with a third semiconductor element 772 having an eighth resistance value. In particular, the sixth current source 770 is communicatively associated or coupled with a drain terminal of the third semiconductor element 772, while the source terminal of the third semiconductor element 772 is coupled with or connected to a source at a ground potential. In various embodiments, a gate terminal of the third semiconductor element 772 is configured to receive the relatively low voltage signal 752 from the output of the third op-amp 754 by implementing a feedback loop, for example a feedback loop 774. The third semiconductor element 772 is similar to the transistors, for example, the transistor 412 of the plurality of transistors 410 (see, e.g., FIG. 4). In various embodiments, a working load of the third semiconductor element 772 is equal to a working load of the load semiconductor element (for example, the transistor 412 discussed in FIG. 4).

In an embodiment, the feedback loops 734 and 774 of the relatively high voltage generation circuit 710 and the relatively low voltage generation circuit 750, respectively ensures that the respective MOS transistor resistors for example, the transistor 412 (see, e.g., FIG. 4), tracks the physical resistor 302 across process corners and temperature. In the present embodiment, the gain of the op-amp, for example, the op-amp 432 is changed across process corners and temperature, thereby adjusting the output slope of the op-amp 432 such that it changes from $V_{HIGH}$ to $V_{LOW}$ across its operating region. Therefore, the attenuation profile of the signal chain remains same across process corners and temperature. In the present embodiment, the op-amp, for example the op-amp 432 is implemented in a manner such that the output slope of the op-amp 432 is changed across the process corners and temperature. In particular, the op-amp 432 may receive an input by a circuit, for example a slope control circuit that may be configured to adjust a gain (or the slope) of the op-amp 432, to thereby control the attenuation profile of the VCA, for example the VCA 208. An exemplary implementation of the control circuit is explained with reference to FIG. 8.

Figure 8:
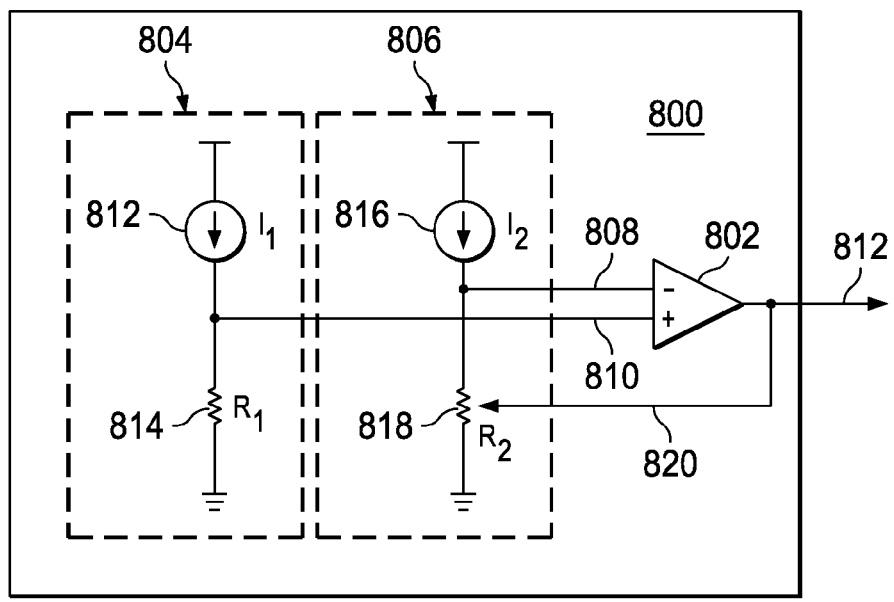
FIG. 8 illustrates an exemplary implementation of a slope adjustment circuit associated with a comparator from among a plurality of comparators in accordance with an embodiment.

FIG. 8 illustrates an exemplary implementation of a control circuit 800 associated with an op-amp, for example, the op-amp 432 (see, e.g., FIG. 4), in accordance with an embodiment. In various embodiments, the control circuit 800 is an example of the control circuit 690 (see, e.g., FIG. 6). In an embodiment, the control circuit 800 is implemented in a manner that at the different process corners and during temperature variations, the op-amp output slope changes such that output slope of the op-amp maintains the attenuation profile of the VCA 208.

As illustrated in FIG. 8, the control circuit 800 includes a fourth op-amp 802, a seventh input circuit 804 and an eighth input circuit 806. The seventh input circuit 804 and the eighth input circuit 806 are configured to generate a seventh input voltage signal ($V_{INM}$), for example, a seventh input voltage signal 808 and an eighth input voltage signal ($V_{INP}$) an eighth input voltage signal 810, respectively. In various embodiments, fourth op-amp 802 is configured to compare the seventh input voltage signal 808 with the eighth input voltage signal 810, and in response generate a slope control signal, for example a slope control signal 812. In various embodiments, the slope control signal 812 is similar to the slope control signal 696 (see, e.g., FIG. 6). In various embodiments, the slope control signal 812 is input to the first semiconductor element, for example the first semiconductor element 664 (see, e.g., FIG. 6) to control the first op-amp output signal, for example, the first op-amp output signal 616.

In various embodiments, the seventh input circuit 804 includes or comprises a seventh current source 812 coupled in series with a resistive element 814. In various embodiments, the resistive element 814 is similar to the first resistive element. In various embodiments, the seventh input circuit 804 is configured to generate the seventh input voltage signal 810 based on a difference of the signal levels of the first reference voltage signal $V_{REF1}$ and the second reference voltage signal $V_{REF2}$, and the third resistance value. Also, the eighth input circuit 806 includes or comprises an eighth current source 816 coupled in series with a resistive element 818. In various embodiments, the resistive element 818 is similar to the first semiconductor element. The eighth input source is configured to generate the eighth input voltage signal based on a difference of the signal levels of the relatively high voltage signal and the relatively low voltage signal, and the fourth resistance value. In various embodiment, the currents $I_1$ and $I_2$ can be generated in the control circuit 800 based on the following expressions:

$$I_1 = k*(V_{REF2}-V_{REF1})/R_3$$

$$I_2 = k*(V_{LOW}-V_{HIGH})/R_4$$

where $R_3$ and $R_4$ are the third resistance value and the fourth resistance values, and k is a proportionality constant.

In various embodiments, the first semiconductor element is implemented using a transistor, for example, a MOS transistor operating in a triode region thereof. In various embodiments, an input to the gate of the MOS transistor is controlled by providing the output of the control circuit, for example, the slope control signal to the gate of the MOS transistor by implementing a feedback loop 820. The feedback loop 820 ensures that the voltages at the input terminals of the fourth op-amp 802 are same, for example,
the seventh input voltage signal 808, $V_{INM}$=the eighth input voltage signal, $V_{INP}$
Accordingly, $I_1*R_1 = I_2*R_2$ $$k*(V_{REF2}-V_{REF1})/R_3 * R_1 = k*(V_{LOW}-V_{HIGH})/R_4 * R_2$$

$$R_2 = R1*R4*(V_{REF2}-V_{REF1})/((V_{LOW}-V_{HIGH})*R_3) \qquad (3)$$

The value of $R_2$ derived in equation (3) satisfies equation (2). Accordingly, in the op-amp, for example, the op-amp 432, the resistance $R_2$ is replaced by the same MOS transistor, and its gate voltage is controlled by the output of the feedback loop 820. As a result, the op-amp output signal gives $V_{HIGH}$ at $V_{CTRL}=V_{REF1}$ and $V_{LOW}$ at $V_{CTRL}=V_{REF2}$ across process corners and temperature variation.

Figure 9:
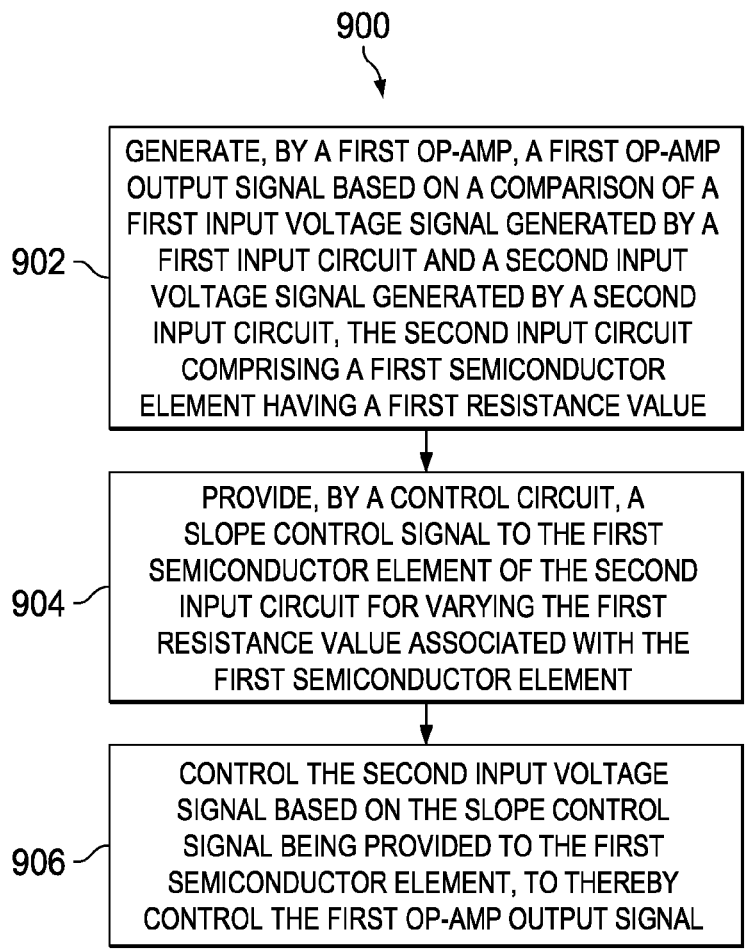
FIG. 9 is a flow diagram of an exemplary method of time gain compensation according to an embodiment.

FIG. 9 is a flow diagram of a method 900 of time gain compensation according to an embodiment. The method 900 includes providing a feedback control to the generation of an input signal that is configured to trigger an operation of a load semiconductor element, such that triggering operation of the load semiconductor element modifies the effective impedance of a set of load semiconductor elements, thereby providing time gain compensation. The method also provides a closed loop generation of supply voltages being provided to the op-amp circuit used for the generation of the input signals. An advantage of providing a closed loop implementation of generation of the input signal and the supply voltage signals is that it reduces the attenuation profile variation across process corners and temperature. In certain embodiments, attenuation profile variation is reduced from +/−3 dB to +/−0.5 dB across process corners and temperatures by utilizing closed loop control in the generation of the input signal as well as supply voltages (for example, a relatively high voltage signal and a relatively low voltage signal). In certain embodiments, operations of method 900 are performed by a circuit, for example, the circuit 600 configured for time gain compensation (see, e.g., FIG. 6).

At 902, the method 900 includes generating, by a first op-amp, a first op-amp output signal based on a comparison of a first input voltage signal generated by a first input circuit and a second input voltage signal generated by a second input circuit. In an embodiment, the second input circuit includes or comprises a first semiconductor element having a first resistance value. An example of the first input circuit is the first input circuit 630 (see, e.g., FIG. 6). In various embodiments, the first input circuit is configured to generate the first input signal based on a difference of signal levels of a first reference voltage signal and a input control voltage signal. In various embodiments, the signal level of the input control voltage signal is varied in order to vary an output of the op-amp, for example, the first op-amp 432 (see, e.g., FIG. 4). For example, the first op-amp output signal includes or comprises the relatively high voltage signal when the input control voltage signal corresponds to the first reference voltage, while the first op-amp output signal includes or comprises a relatively low voltage signal when the input control voltage signal corresponds to a second reference voltage signal.

In an embodiment, the second input circuit includes or comprises a second current source communicatively associated or coupled with a first resistive element having a second resistance value. An example of the second input circuit is the second input circuit 660 (see, e.g., FIG. 6). In various embodiments, the second input circuit 660 is configured to generate the second input signal based on a difference of signal levels of an op-amp output signal and a relatively high voltage signal.

At 904, the method 900 includes providing, by a control circuit, a slope control signal to a first semiconductor element of the second input circuit so as to vary the first resistance value associated with the first semiconductor element. An example of the control circuit is the control circuit 800 (see, e.g., FIG. 8).

At 906, the method 900 includes controlling the second input voltage signal based on the slope control signal being provided to the first semiconductor element, to thereby control the first op-amp output signal. In various embodiments, the first op-amp output signal is input to a gate terminal of a load semiconductor element so as to vary an impedance of the load semiconductor element.

In various other embodiments, the method includes 900 generating the relatively high voltage signal and the relatively low voltage signal in a closed loop architecture. As disclosed herein, generating the relatively high voltage signal and the relatively low voltage signal in the closed loop facilitates in tracking a variation of the load semiconductor element (for example, the load semiconductor element 412 in FIG. 4) with respect to a series resistor element (for example, the series resistor element 302 in FIG. 4) of the VCA during temperature variations and process corners.

In an embodiment, the relatively high voltage signal is generated in a closed loop by implementing a relatively high voltage signal generation circuit, for example, the relatively high voltage signal generation circuit 710 (see, e.g., FIG. 7). Various exemplary components of the relatively high voltage generation circuit 710 and functionalities thereof are explained in detail with reference to FIG. 7A.

In an embodiment, the relatively low voltage signal is generated in a closed loop by implementing a relatively low voltage signal generation circuit, for example, the relatively low voltage signal generation circuit 750 (see, e.g., FIG. 7B). Various exemplary components of the relatively low voltage generation circuit 750 and functionalities thereof are explained in detail with reference to FIG. 7B.

Figure 10:
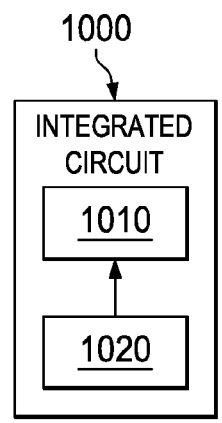
FIG. 10 is a block diagram of an exemplary integrated circuit (IC) incorporating a time gain compensation circuit in accordance with an embodiment.

FIG. 10 is a block diagram for an IC 1000 incorporating the time gain compensation circuit 600 of FIG. 6 in accordance with an embodiment. As depicted in FIG. 10, the IC 1000 includes a set of load semiconductor elements 1010 and a time gain compensation circuit 1020. The set of load semiconductor elements 1010 is configured to provide a varying impedance. In particular, switching the load semiconductor elements from among the set of load semiconductor elements one after another from an ON state to an OFF state varies the impedance, and thereby provide the time gain compensation.

The time gain compensation circuit 1020 is coupled with or connected to the set of load semiconductor elements 1010 and is configured to configured to switch the load semiconductor elements from among the set of load semiconductor elements from an ON state to an OFF state so as to vary the impedance. The time gain compensation circuit 1020 and components thereof are similar in function and operation to the time gain compensation circuit 600. For example, the time gain compensation circuit 1020 comprises or includes a set of first op-amps, a set of first input circuits, a set of second input circuits and a control circuit, wherein each first op-amp from among the set of first op-amps is similar to the first op-amp (for example, the first op-amp 432); each first input circuit from among the set of the first input circuit is similar to the first input circuit 630, each second input circuit from among the set of the second input circuit is similar to the second input circuit 660, and the control circuit is similar to the control circuit 690. The description and various corresponding components of the first op-amp 432, the first input circuit 630, the second input circuit 660, and the control circuit 690 associated with the time gain compensation circuit 600 are explained with reference to FIGS. 4 through 8, and description thereof is omitted from herein for the sake of brevity of the description.

As described above, the circuits, devices (e.g., apparatuses) and methods of the present disclosure include solutions for providing time gain compensation in various applications, such as ultrasound systems. It is noted, therefore, that the present disclosure discloses several features that enable the operation of receiver AFE associated with the ultrasound systems in an efficient manner. Additionally, the disclosed techniques facilitate reduction of variation in attenuation profile across process corners and temperature variation.

Various disclosed systems include an architecture having a closed loop architecture for generation of an gate voltage signal input to load semiconductor elements, for example MOS transistors that may be switched from an ON state to an OFF state for provisioning of the time gain compensation. In particular, the time gain compensation circuit includes or comprises a relatively high voltage generation circuit and a relatively low voltage generation circuit for generation of a relatively high voltage signal and a relatively low voltage signal for each first op-amp of the set of first op-amps in a closed loop, thereby compensating the effects of temperature variation and process corners on MOS resistor value change with respect to physical resistor value.

In various other embodiments, the architecture of the time gain compensation circuit further includes a closed loop architecture to provide an output of the circuit back to one of the inputs to thereby adjust the gain (or the slope of the output of the op-amp) such that the slope varies from $V_{HIGH}$ to $V_{LOW}$ across the operating range of the op-amp, thereby maintaining the attenuation profile same across the process corners and temperature variation.

It should be noted that reference throughout this specification to features, advantages, or similar language does not imply that all of the features and advantages should be or are in any single embodiment. Rather, language referring to the features and advantages may be understood to mean that a specific feature, advantage, or characteristic described in connection with an embodiment is included in at least one embodiment of the present technology. Thus, discussions of the features and advantages, and similar language, throughout this specification may, but do not necessarily, refer to the same embodiment.

Various embodiments of the present disclosure, as discussed above, may be practiced with steps and/or operations in a different order, and/or with hardware elements in configurations which are different than those which are disclosed. Therefore, although the technology has been described based upon these exemplary embodiments, it is noted that certain modifications, variations, and alternative constructions may be apparent and well within the spirit and scope of the technology.

Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. A circuit for time gain compensation comprising:
   a first op-amp comprising an output terminal, the first op-amp configured to conduct a comparison between first and second input voltage signals and output a first op-amp output signal based on the comparison;
   a first input circuit coupled with the first op-amp and configured to provide the first input voltage signal to the first op-amp, the first input signal being generated based on signal levels of an input control voltage signal and a first reference voltage signal;
   a second input circuit comprising a first semiconductor element, the second input circuit coupled with the output terminal, the second input circuit configured to provide the second input voltage signal to the first op-amp, the second input voltage signal being generated based on signal levels of the first op-amp output signal and a relatively high voltage signal; and
   a control circuit coupled with the first semiconductor element and configured to vary a first resistance value of the first semiconductor element to thereby control the first op-amp output signal, the first op-amp output signal comprising the relatively high voltage signal when the input control voltage signal corresponds to the first reference voltage, and the first op-amp output signal comprising a relatively low voltage signal when the input control voltage signal corresponds to a second reference voltage signal, the relatively high voltage signal being higher than the relatively low voltage signal, the first op-amp output signal being input to a gate terminal of a load semiconductor element so as to vary an impedance of the load semiconductor element.

2. The circuit of claim 1, wherein the first input circuit comprises:
   a first current source coupled with the first op-amp and configured to generate a first current signal; and
   a first resistive element coupled with the first current source, the first resistive element comprising a second resistance value, wherein the first input circuit is configured to provide the first input voltage signal based on the first current signal and the second resistance value.

3. The circuit of claim 2, wherein the first current source comprises a first differential circuit configured to receive the input control voltage signal and the first reference voltage signal as inputs, and generate the first current signal based on a difference of signal levels of the input control voltage signal and the first reference voltage signal, and a second resistive element having a third resistance value.

4. The circuit of claim 1, wherein the second input circuit further comprises:
   a second current source coupled with the first semiconductor element and the first op-amp, and configured to generate a second current signal,
   wherein the second input circuit is configured to provide the second input voltage signal to the first op-amp based on the second current signal and the first resistance value.

5. The circuit of claim 4, wherein the second current source comprises a second differential circuit configured to receive the first op-amp output signal and the relatively high voltage signal as inputs, and generate the second current signal based on a difference of signal levels of the first op-amp output signal and the relatively high voltage signal, and a second resistive element having a third resistance value.

6. The circuit of claim 4, wherein the first semiconductor element comprises a metal oxide semiconductor (MOS) transistor.

7. The circuit of claim 1 further comprising a relatively high voltage generation circuit coupled with the first op-amp, and configured to generate the relatively high voltage signal, the relatively high voltage generation circuit comprising:
   a second op-amp configured to compare a third input voltage signal with a fourth input voltage signal and in response generate the relatively high voltage signal;
   a third input circuit coupled with the second op-amp and configured to provide the third input voltage signal, the third input circuit comprising a third current source coupled with a fourth resistive element having a fifth resistance value, the fifth resistance value being equal to an ON-resistance value of the load semiconductor element; and
   a fourth input circuit coupled with the second op-amp and configured to provide the fourth input voltage signal to the second op-amp, the fourth input circuit comprising a fourth current source coupled with a second semiconductor element having a sixth resistance value, a gate terminal of the second semiconductor element being configured to receive the relatively high voltage signal, wherein a working load of the second semiconductor element is equal to a working load of the load semiconductor element.

8. The circuit of claim 1, further comprising a relatively low voltage generation circuit coupled with the first op-amp, relatively low voltage generation circuit configured to generate the relatively low voltage signal, the relatively low voltage generation circuit comprising:
   a third op-amp configured to compare a fifth input voltage signal with a sixth input voltage signal and in response generate the relatively low voltage signal;
   a fifth input circuit coupled with the third op-amp and configured to provide the fifth input voltage signal, the fifth input circuit comprising a fifth current source coupled with a fifth resistive element having a seventh resistance value, the seventh resistance value being equal to an OFF-resistance value of the load semiconductor element; and
   a sixth input circuit coupled with the third op-amp and configured to provide the sixth input voltage signal to the third op-amp, the sixth input circuit comprising a sixth current source coupled with a third semiconductor element having an eighth resistance value, a gate terminal of the third semiconductor element being configured to receive the relatively low voltage signal, wherein a working load of the third semiconductor element is equal to a working load of the load semiconductor element.

9. The circuit of claim 1, wherein the control circuit comprises:
   a fourth op-amp configured to compare a seventh input voltage signal with an eighth input voltage signal and in response generate a slope control signal, the slope control signal being input to the first semiconductor element to control the first op-amp output signal;
   a seventh input circuit configured to generate the seventh input voltage signal based on a difference of the signal levels of the first reference voltage signal and the second reference voltage signal, and the third resistance value; and
   an eighth input circuit configured to generate the eighth input voltage signal based on a difference of the signal levels of the relatively high voltage signal and the relatively low voltage signal, and the fourth resistance value.

10. A method of time gain compensation, the method comprising:

generating, by a first op-amp, a first op-amp output signal based on a comparison of a first input voltage signal generated by a first input circuit and a second input voltage signal generated by a second input circuit, the second input circuit comprising a first semiconductor element having a first resistance value;

providing, by a control circuit, a slope control signal to the first semiconductor element of the second input circuit so as to vary the first resistance value associated with the first semiconductor element; and controlling the second input voltage signal based on the slope control signal provided to the first semiconductor element to thereby control the first op-amp output signal, the first op-amp output signal comprising a relatively high voltage signal when an input control voltage signal corresponds to a first reference voltage, and the first op-amp output signal comprising a relatively low voltage signal when the input control voltage signal corresponds to a second reference voltage signal, the relatively high voltage signal being higher than the relatively low voltage signal, the first input voltage signal being generated based on signal levels of the input control voltage signal and the first reference voltage signal, the second input voltage signal being generated based on signal levels of the first op-amp output signal and the relatively high voltage signal, and the first op-amp output signal being an input to a gate terminal of a load semiconductor element so as to vary an output of the load semiconductor element.

11. The method of claim 10, wherein generating the first input voltage signal comprises:

generating, by a first current source, a first current signal based on a difference of the input control voltage signal and the first reference voltage signal, and a second resistive element having a third resistance value; and converting, by a first resistive element, the first current signal to the first input voltage signal based on a second resistance value associated with the first resistive element, the first resistive element being coupled with the first current source.

12. The method of claim 10, further comprising:

providing, by the first op-amp, the first op-amp output signal to the second input circuit as an input;

generating, by a second current source, a second current signal based on a difference of the first op-amp output signal and the relatively high voltage signal, and a third resistance value, the third resistance value being associated with a fourth resistive element being coupled with the second current source; and converting, by the first semiconductor element, the second current signal into the second input voltage signal.

13. The method of claim 10, further comprising generating the relatively high voltage signal by a relatively high voltage signal generation circuit, the relatively high voltage generation circuit being coupled with the first op-amp, wherein the relatively high voltage generation circuit comprises:

a second op-amp configured to compare a third input voltage signal with a fourth input voltage signal and in response generate the relatively high voltage signal;

a third input circuit coupled with the second op-amp and configured to provide the third input voltage signal, the third input circuit comprising a third current source coupled with a fourth resistive element having a fifth resistance value, the fifth resistance value being equal to an ON-resistance value of the load semiconductor element; and a fourth input circuit coupled with the second op-amp and configured to provide the fourth input voltage signal to the second op-amp, the fourth input circuit comprising a fourth current source coupled with a second semiconductor element having a sixth resistance value, a gate terminal of the second semiconductor element being configured to receive the relatively high voltage signal, wherein a working load of the second semiconductor element is equal to working load of the load semiconductor element.

14. The method of claim 10, further comprising generating the relatively low voltage signal by a relatively low voltage signal generation circuit coupled with the first op-amp, wherein the relatively low voltage generation circuit comprises:

a third op-amp configured to compare a fifth input voltage signal with a sixth input voltage signal and in response generate the relatively low voltage signal;

a fifth input circuit coupled with the third op-amp and configured to provide the fifth input voltage signal, the fifth input circuit comprising a fifth current source coupled with a fifth resistive element having a seventh resistance value, the seventh resistance value being equal to an OFF-resistance value of the load semiconductor element; and a sixth input circuit coupled with the third op-amp and configured to provide the sixth input voltage signal to the third op-amp, the sixth input circuit comprising a sixth current source coupled with a third semiconductor element having an eighth resistance value, a gate terminal of the third semiconductor element being configured to receive the relatively low voltage signal, wherein a working load of the third semiconductor element is equal to a working load of the load semiconductor element.

15. An integrated circuit (IC) configured for time gain compensation, the IC comprising:

a set of load semiconductor elements configured to provide an impedance, load semiconductor elements from the set of load semiconductor elements being switched from an ON state to an OFF state one after another so as to vary the impedance to thereby provide time gain compensation;

a time gain compensation circuit coupled with the set of load semiconductor elements and configured to facilitate switching of the load semiconductor elements of the set of load semiconductor elements from the ON state to the OFF state, the time gain compensation circuit comprising:

a set of first op-amps, each first op-amp of the set of first op-amps coupled with a respective load semiconductor element of the set of load semiconductor elements, and comprising a respective output terminal and configured to conduct a comparison between a respective first input voltage signal and a respective second input voltage signal, and output a respective first op-amp output signal based on the comparison;

a set of first input circuits coupled with the respective first op-amp of the set of first op-amps, and configured to provide the respective first input voltage signal to the respective first op-amp, the respective first input voltage signal being generated based on signal levels of an input control voltage signal and a respective first reference voltage signal input to the respective first op-amp;

a set of second input circuits, each second input circuit of the set of second input circuits comprising a respective first semiconductor element, each of the second input circuit being coupled with the output terminal of the respective first op-amp, each of the second input circuit configured to provide the respective second input voltage signal to the respective first op-amp, the second input voltage signal being generated based on signal levels of the respective first op-amp output signal and a relatively high voltage signal; and a control circuit coupled with each of the first semiconductor element of a set of first semiconductor elements and configured to vary a first resistance value of the each of the first semiconductor element to thereby control the first op-amp output signal, the first op-amp output signal comprising the relatively high voltage signal when the input control voltage signal corresponds to the respective first reference voltage associated with the respective first op-amp, and the first op-amp output signal comprising a relatively low voltage signal when the input control voltage signal corresponds to a respective second reference voltage signal associated with the respective first op-amp, the respective first op-amp output signal being input to a respective gate terminal of a respective load semiconductor element from among the set of load semiconductor elements so as to vary an impedance of the set of load semiconductor elements, and the relatively high voltage signal being higher than the relatively low voltage signal.

16. The IC of claim 15, wherein each input circuit of the set of first input circuits comprises:
a first current source coupled with the respective first op-amp and configured to generate a first current signal, the first current source comprising a first differential circuit, the first differential circuit configured to:
receive the input control voltage signal and the respective first reference voltage signal as inputs, and
generate the first current signal based on a difference of signal levels of the input control voltage signal and the respective first reference voltage signal, and a second resistive element having a third resistance value, and
a first resistive element coupled with the first current source, the first resistive element comprising a second resistance value, wherein the each first input circuit is configured to provide the first input voltage signal based on the first current signal and the second resistance value.

17. The IC of claim 15, wherein each second input circuit of the set of second input circuits comprises:
a second current source coupled with the respective first semiconductor element and the respective first op-amp, and configured to generate a second current signal,
the second current source comprising a second differential circuit, the second differential circuit configured to:
receive the respective first op-amp output signal and the relatively high voltage signal as inputs, and
generate the respective second current signal based on a difference of signal levels of the respective first op-amp output signal and the relatively high voltage signal, and a second resistive element having a third resistance value,
wherein the each second input circuit is configured to provide the respective second input voltage signal to the respective first op-amp based on the second current signal and the first resistance value.

18. The IC of claim 15 further comprising a relatively high voltage generation circuit coupled with each of the first op-amp, and configured to generate the relatively high voltage signal for each of the first op-amp, the relatively high voltage generation circuit comprising:
a second op-amp configured to compare a third input voltage signal with a fourth input voltage signal and in response generate the relatively high voltage signal;
a third input circuit coupled with the second op-amp and configured to provide the third input voltage signal, the third input circuit comprising a third current source coupled with a fourth resistive element having a fifth resistance value, the fifth resistance value being equal to an ON-resistance value of the load semiconductor element; and
a fourth input circuit coupled with the second op-amp and configured to provide the fourth input voltage signal to the second op-amp, the fourth input circuit comprising a fourth current source coupled with a second semiconductor element having a sixth resistance value, a gate terminal of the second semiconductor element being configured to receive the relatively high voltage signal, wherein a working load of the second semiconductor element is equal to a working load of the load semiconductor element.

19. The IC of claim 15 further comprising a relatively low voltage generation circuit coupled with each of the first op-amp, and configured to generate the relatively low voltage signal, the relatively low voltage generation circuit comprising:
a third op-amp configured to compare a fifth input voltage signal with a sixth input voltage signal and in response generate the relatively low voltage signal;
a fifth input circuit coupled with the third op-amp and configured to provide the fifth input voltage signal, the fifth input circuit comprising a fifth current source coupled with a fifth resistive element having a seventh resistance value, the seventh resistance value being equal to an OFF-resistance value of the load semiconductor element;
a sixth input circuit coupled with the third op-amp and configured to provide the sixth input voltage signal to the third op-amp, the sixth input circuit comprising a sixth current source coupled with a third semiconductor element having an eighth resistance value, a gate terminal of the third semiconductor element being configured to receive the relatively low voltage signal, wherein a working load of the third semiconductor element is equal to a working load of the load semiconductor element.

20. The IC of claim 15, wherein the control circuit comprises:
a fourth op-amp configured to compare a seventh input voltage signal with an eighth input voltage signal and in response generate the slope control signal, the slope control signal being input to the each first semiconductor element to control each of the first op-amp output signal;
a seventh input circuit coupled with the fourth op-amp, and configured to generate the seventh input voltage signal based on a difference of the signal levels of the first reference voltage signal and the second reference voltage signal associated with a first op-amp of the set of first op-amps, and the third resistance value; and
an eighth input circuit coupled with the fourth op-amp, and configured to generate the eighth input voltage signal based on a difference of the signal levels of the relatively high voltage signal and the relatively low voltage signal, and the fourth resistance value.

* * * * *